United States Patent
Gao et al.

(10) Patent No.: US 8,582,115 B2
(45) Date of Patent: Nov. 12, 2013

(54) TUNABLE AND SWITCHABLE MULTILAYER OPTICAL DEVICES

(75) Inventors: Lu Gao, San Jose, CA (US); Paulo E. X. Silveira, Boulder, CO (US); Mark Meloni, Longmont, CO (US)

(73) Assignee: OmniVision Technologies, Inc., Santa Clara, CA (US)

( * ) Notice: Subject to any disclaimer, the term of this patent is extended or adjusted under 35 U.S.C. 154(b) by 426 days.

(21) Appl. No.: 12/900,254

(22) Filed: Oct. 7, 2010

(65) Prior Publication Data

US 2012/0086949 A1    Apr. 12, 2012

(51) Int. Cl.
  *G01B 9/02*    (2006.01)
  *G02B 5/18*    (2006.01)
  *G01D 5/36*    (2006.01)

(52) U.S. Cl.
  USPC ......................... 356/521; 250/237 G; 359/569

(58) Field of Classification Search
  USPC ......... 356/454, 515, 519, 521, 432, 436–440; 359/260, 566, 577–579; 349/198, 201; 250/237 G, 550
  See application file for complete search history.

(56) References Cited

U.S. PATENT DOCUMENTS

| | | | |
|---|---|---|---|
| 3,247,392 A | 4/1966 | Thelen | |
| 4,251,137 A * | 2/1981 | Knop et al. | 349/201 |
| 5,526,951 A | 6/1996 | Bailey et al. | |
| 6,850,365 B2 * | 2/2005 | Ishikawa | 359/586 |
| 2004/0239869 A1 * | 12/2004 | Cavanaugh et al. | 349/198 |
| 2008/0186581 A1 * | 8/2008 | Bita et al. | 359/578 |
| 2008/0239420 A1 * | 10/2008 | McGrew | 359/11 |
| 2009/0296218 A1 * | 12/2009 | Ryytty | 359/573 |
| 2010/0165134 A1 | 7/2010 | Dowski, Jr. et al. | |

* cited by examiner

*Primary Examiner* — Gregory J Toatley
*Assistant Examiner* — Dominic J Bologna
(74) *Attorney, Agent, or Firm* — Lathrop & Gage LLP (57) ABSTRACT

A multilayer optical device includes an arrangement, on a substrate, of a first layer, a second layer, and a space therebetween. The second layer is a thin-film. The arrangement of the first and second layers and the space therebetween produces transmitted, reflected, or dispersed spectrally modified electromagnetic energy from electromagnetic energy incident upon the arrangement. An optical function of the device is dependent at least in part on interference effects. An optical detector system includes a similar multilayer optical device. The space within the device is in fluid communication with structures for receiving a fluid such that the device operates in a first or second mode depending on absence or presence of the fluid within the space. The system includes a detector for receiving the modified electromagnetic energy, and a controller in fluid communication with the space that establishes the absence or presence of the fluid in the space.

26 Claims, 8 Drawing Sheets

TUNABLE AND SWITCHABLE MULTILAYER OPTICAL DEVICES

FIELD OF THE INVENTION

The present disclosure relates to the field of multilayer optical devices, such as interference filters, dichroic mirrors, diffraction gratings, and other devices that rely on interference.

BACKGROUND

Sandwiches of multiple, thin, controlled-thickness layers of transparent or semi-transparent materials, where the layers are of materials having two or more different indices of refraction, can be used to form interference filters, dichroic mirrors, and other optical components capable of interacting with electromagnetic radiation of particular wavelengths. For simplicity, such devices are referred to herein as multilayer optical components, and operate through interference effects that occur because there is at least some reflection at each boundary between layers of the sandwich. The reflected and transmitted light from each of the boundaries may sum or cancel at particular wavelengths. For example, light reflections from two boundaries can cancel each other if the round-trip distance between boundaries is N wavelengths plus half a wavelength, or can reinforce each other if the round-trip distance between boundaries is N+1 wavelength (for integer N greater than or equal to zero).

The amount of reflection at each boundary depends in part on a difference between the indices of refraction of adjacent layers forming the boundary. The optical properties of the sandwich, and thus of the multilayer optical component, are determined in part by the materials of each layer, as well as their thicknesses.

By careful selection and application of layers of particular thickness, layer order, and index of refraction, multilayer optical components functional as optical bandpass filters, optical band-stop filters, wavelength-selective mirrors, anti-reflection coatings, and other optical devices are commonly made. U.S. Pat. No. 3,247,392 to Thelen (1961) describes some of the optical components available of this type. While these interference effects can be observed in liquids as well as solids, and materials of biological as well as mineral or manufactured origin, most manufactured devices rely on layers of solid materials. These multilayer optical components are capable of spectrally modifying incident electromagnetic radiation in a manner not reliant on selective absorption, and a manner dependent on interference effects, because their light reflection and/or transmission is wavelength-dependent such that they may separate, or transmit or reflect differently, two components of incident light having different wavelengths.

It is occasionally desirable to provide tunability of optical components. For example, a strong demand exists for tunable lasers. Some multilayer optical components have been built that are tuned to desired wavelengths by altering the angle of incident light arriving on the component's surface; since light arriving at an angle from normal passes through more material between boundaries than light arriving normal to the surface, the light arriving at an angle exhibits interference effects at longer wavelengths than the light arriving normal to the surface. Altering the angle of incident light is typically performed by rotating components. It is not always convenient to optically tune components by rotating them.

There are existing methods, based on those used for semiconductor fabrication, for creating small structures that have a top plate suspended over an air-filled space above a substrate or underlying layer. As an example, U.S. Pat. No. 5,526,951, the disclosure of which is incorporated herein by reference, describes a process for forming micromirrors, each of which are supported by a pivoting support structure and suspended over a narrow air space or cavity above an underlying layer or substrate.

SUMMARY

In an embodiment, a multilayer optical device includes an arrangement, formed on a substrate, of at least a first layer, a second layer, and a space provided therebetween, wherein the second layer is a thin-film. The space has a height, and the arrangement of the first layer, the second layer, and the space between is capable of producing transmitted, reflected, or dispersed spectrally modified electromagnetic energy from electromagnetic energy incident upon the arrangement. An optical function of the optical device is dependent at least in part on interference effects.

In an embodiment, an optical detector system includes a multilayer optical device having an arrangement, formed on a substrate, of at least a first layer, a second layer, and a spacer provided therebetween. The spacer has a spacer height, and the arrangement of the first layer, the second layer and the spacer defines a space that is capable of modifying incident electromagnetic energy in a spectrally-dependent manner through interference. The space is in fluid communication with structures for receiving a first fluid such that the optical device operates in a first mode with the first fluid absent in the space, and in a second mode with the first fluid present in the space. The system also includes a detector in optical communication with the optical device for receiving modified electromagnetic energy from the multilayer optical device, and a controller in fluid communication with the space and operable to establish the absence or presence of the first fluid in the space.

DETAILED DESCRIPTION OF THE EMBODIMENTS

In recent times, much work has been done to leverage semiconductor processing technology to make micromechanical devices and devices having both electronic and micromechanical components. Such micromechanical components may include cavities between layers of materials. For example, pressure sensors have been constructed by forming a film of a material such as silicon dioxide over a sealed cavity on a surface of a silicon wafer. Deflection of the film is monitored as a measure of pressure. Similarly, projection display devices are marketed by Texas Instruments that operate by electrostatically deflecting aluminum micromechanical mirrors framed over air-filled cavities formed over a surface of a semiconductor wafer are known, but these display devices rely on reflectance at the mirror surface and do not rely on interference effects, and their function does not depend on refractive index of a fluid.

Typically, such a cavity between layers is formed by a process involving (1) deposition of a sacrificial layer on a substrate resistant to a selected etching process, (2) deposition of a roof layer of a material resistant to the selected etching process, (3) making openings in the roof layer to expose the sacrificial layer, and (4) etching away the sacrificial layer to create a cavity. The roof layer may be supported over the cavity by spacers formed from pedestals of remaining sacrificial layer material, by spacers formed by support-posts formed in holes etched in the sacrificial layer prior to deposition of the roof layer, or selected portions of the sacrificial layer may be removed prior to deposition of the roof layer, allowing the roof layer to contact substrate 106 at particular locations to form integral spacers. A cavity thus formed typically has a rest height determined at least in part by a thickness of the sacrificial layer.

Additional layers may be deposited on top of the roof layer. Such layers, also typically found in such devices as micromachined pressure sensors, may include sealing and passivation layers, as well as conductive and strain-gauge sensor layers.

Air and vacuum have low dielectric constants (e.g., near 1.0). Liquids typically have higher dielectric constants than 1.0.

In an embodiment, an interference-based, multilayer, optical component 100 (FIG. 1) includes an arrangement of two or more layers of materials, such as roof layer 102 formed over a cavity and supported by supports 108 over a substrate 106. The cavity represents a space that typically was occupied by a sacrificial layer 104 at an early stage of processing. Substrate 106 may be an integrated circuit having semiconductor junctions within it, or it may be a rigid or flexible sheet or lens of glass or other transparent material, it may be an opaque or light-absorbing material, or it may have other mechanical, electrical, or optical properties.

Figure 1:
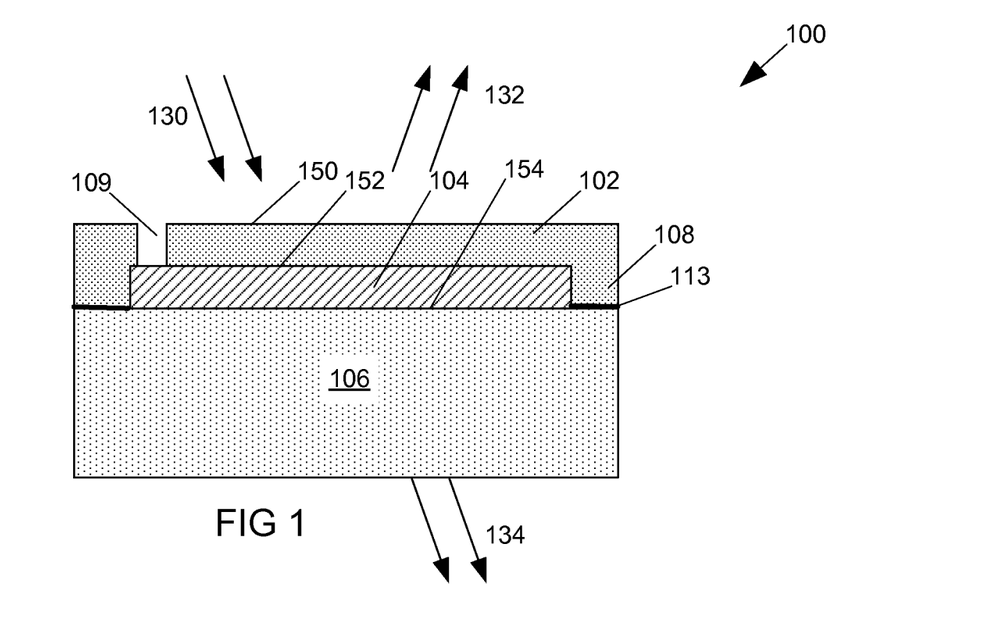
FIG. 1 is a cross section of a partially fabricated, simple, multilayer optical component.
Figure 2:
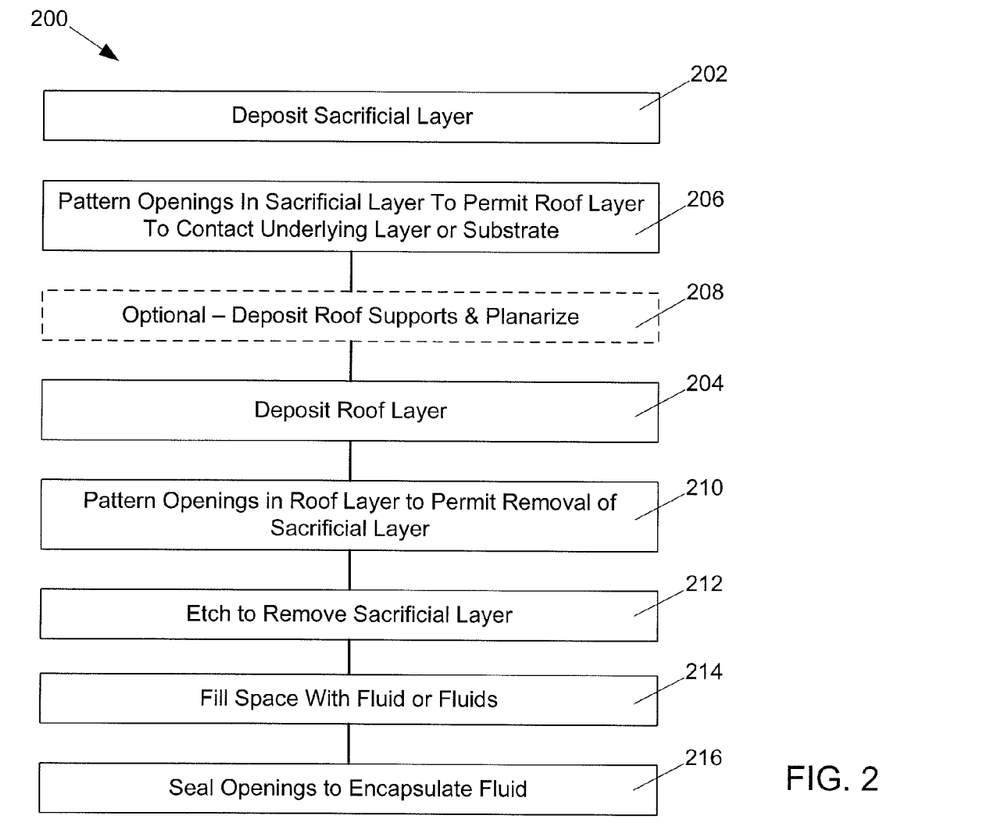
FIG. 2 is a flowchart of a process for making a multilayer optical component, in accord with an embodiment.

In an embodiment, with reference to FIG. 1 for component 100 and FIG. 2 for steps of a method 200 of its manufacture, component 100 is formed by first chemically cleaning substrate 106, then depositing two or more layers of two or more materials, such as first depositing 202 sacrificial layer 104 and second depositing 204 roof layer 102, using one or more semiconductor fabrication-compatible deposition processes for depositing thin films on a substrate such as sputtering, chemical vapor deposition, and evaporative deposition.

After each layer, such as sacrificial layer 104, is deposited 202, that deposited layer may be patterned 206 to create openings to underlying layers or substrate 106 with methods similar to those used for patterning in semiconductor processing, including deposition of photoresist, exposure of the photoresist with patterned light or with an electron beam, developing the photoresist to expose regions to an etching process, etching exposed regions, and stripping the photoresist. Patterning of layers that will later be removed, such as sacrificial layer 104, permits overlying layers such as roof layer 102 to contact underlying layers or substrate 106 and to thereby form supporting structures, such as support 108, that will hold roof layer 102 in place yet separated from underlying layers or substrate 106 once sacrificial layer 104 is removed.

In an alternative embodiment, supports 108 are formed by depositing 208 supporting plugs of a material resistant to etching process 212 for removing sacrificial layer 104. The supporting plugs are typically deposited as a layer, followed by planarizing. Planarizing, if performed, is typically by mechanical-chemical polishing as known in the semiconductor fabrication art and is performed prior to depositing the roof layer 102.

Figure 1A:
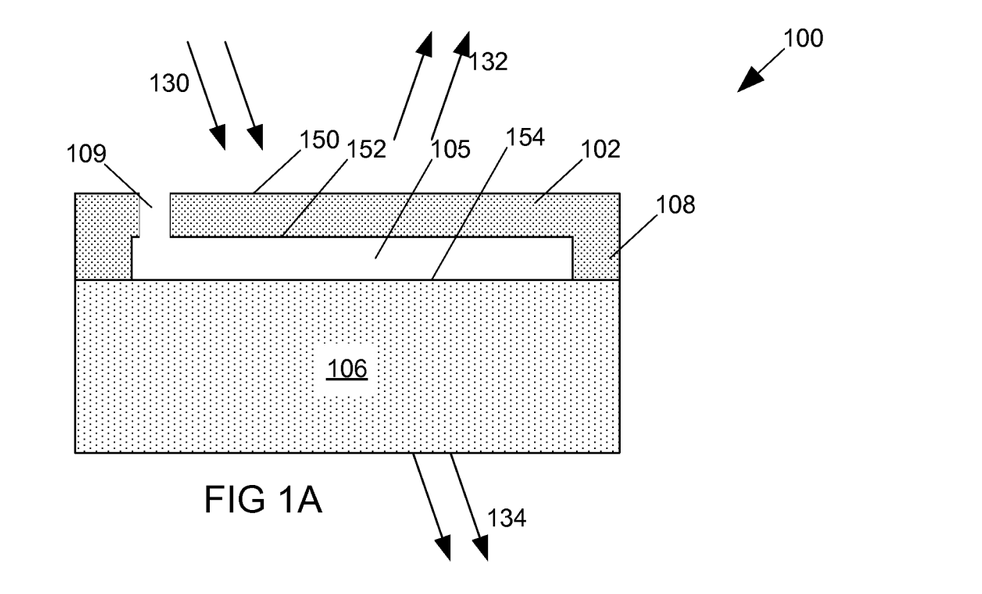
FIG. 1A is a cross section of the partially fabricated multilayer optical component of FIG. 1 after removal of a sacrificial layer.

Next, roof layer 102 is patterned 210 to create one or more openings 109 through which sacrificial layer 104 may be removed. Sacrificial layer 104 is then removed, as illustrated with further reference to FIG. 1A leaving a space 105, typically by etching 212 sacrificial layer 104; however in alternative embodiments sacrificial layer 104 may be removed by dissolution in a solvent, by pyrolysis, or by evaporation.

Figure 1B:
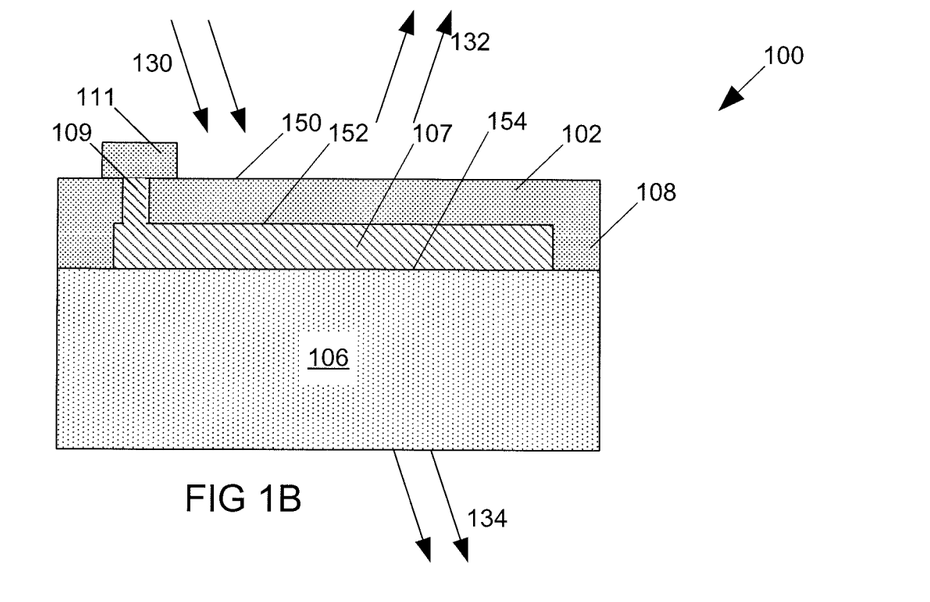
FIG. 1B is a cross section of the multilayer optical component of FIG. 1 after removal of a sacrificial layer and insertion of a fluid.
Figure 1C:
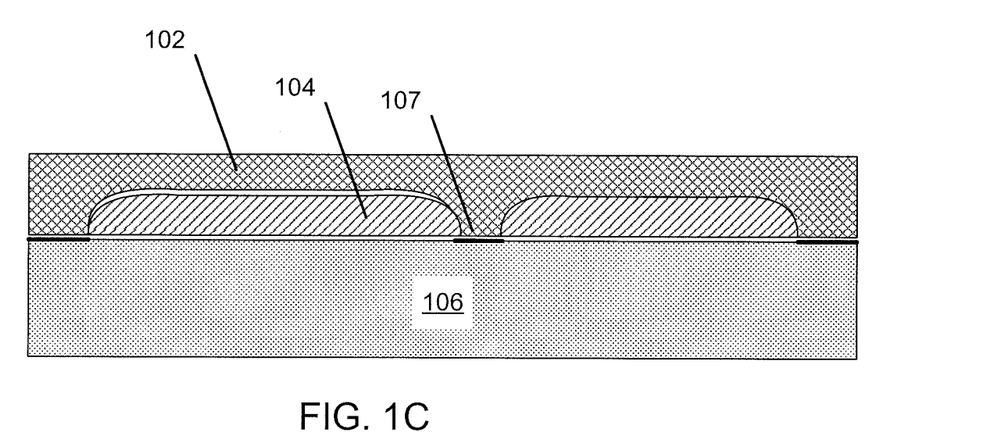
FIG. 1C is a cross section of a partially fabricated multilayer optical component having a melted sacrificial layer serving as fluid and using hydrophobic ink for definition of the sacrificial layer, in accord with an embodiment.

Next, the cavity formed beneath roof layer 102 where sacrificial layer 104 was formerly located is filled 214 with a fluid, as illustrated with further reference to FIG. 1B. In an embodiment, the fluid is a gas such as air. In an alternative embodiment, the fluid is a liquid 107 that is transparent or semi-transparent at electromagnetic wavelengths of interest, and fills the cavity by capillary action. The fluid typically has, or if there are more than one fluids used in a system, at least one of the fluids has, an index of refraction that differs from an index of refraction of roof layer 102 and of the underlying layers or substrate 106.

An additional sealing or passivation layer 111 (FIG. 1B) is then added 216 to encapsulate the fluid by covering and sealing the openings 109 through which sacrificial layer 104 was removed 212 and space filled 214 with fluid 107. Additional overlying layers may be added, including electrode layers or electrothermal resistance layers in further processing, as illustrated in FIGS. 3, 4, 4A, 4B, and 5.

In an alternative embodiment, sacrificial layer 104 is formed of a material that is solid at a low temperature; in this embodiment sacrificial layer 104 is formed, openings for supports 108 patterned, and roof layer 102 deposited at the low temperature. Once sacrificial layer 104 is covered by roof layer 102, the device is allowed to warm to an operating temperature where sacrificial layer 104 melts to become a fluid 107, this embodiment is known herein as having a melted fluid.

Figure 1D:
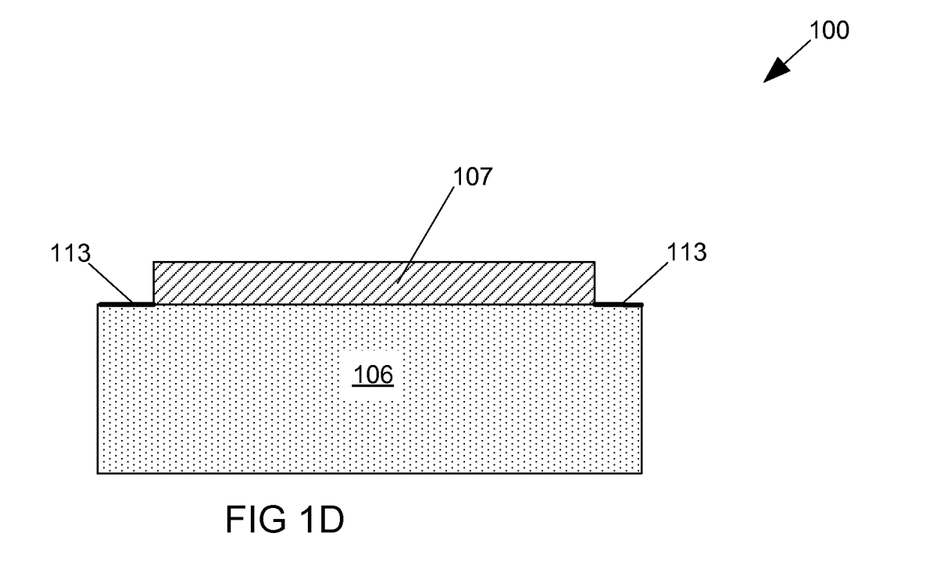
FIG. 1D is a cross section of the partially fabricated optical component of FIG. 1 at an earlier stage of fabrication than that illustrated in FIG. 1.

In an embodiment, illustrated in FIG. 1D and FIG. 1, that exploits the principle that polar and nonpolar fluids tend to be immiscible, there is a polar melted fluid 107. A hydrophobic ink 113 is applied to substrate 106 where openings for supports 108 are desired; alternatively, a hydrophilic ink may be applied where the polar melted fluid is desired.

Polar fluid 107 is then applied in liquid form; this fluid is repelled by ink 113 and accumulates to form a sacrificial layer 104 (FIG. 1) where ink 113 is not present on underlying layers or substrate 106. The partially fabricated device is then cooled to freeze the sacrificial layer to permit deposition of overlying roof layer 102 on top of sacrificial layer 104. Alternatively, openings for supports 108 are created by use of ion-beam milling to permit formation of openings in sacrificial layer 104 without need for photoresist or photoresist developers. In this embodiment, no openings 109 need be formed in roof layer 102 for removal of sacrificial layer 104, since sacrificial layer 104 is merely melted, and is not removed, to become fluid 107.

Annealing or other heat treatment may be performed after deposition of one or more layers to enhance optical, mechanical, or electrical properties of the layers.

Figure 2A:
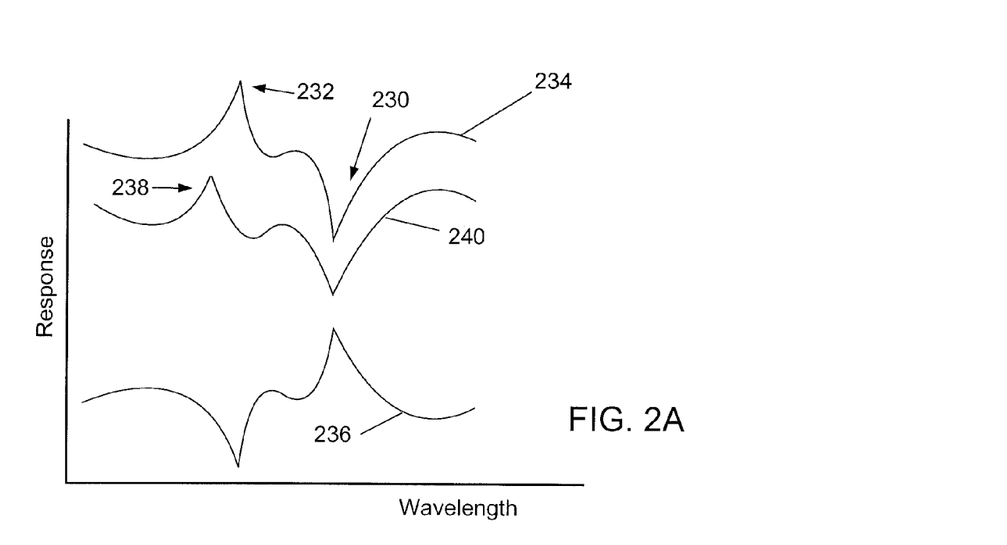
FIG. 2A is an illustration of spectral features that may be provided by a multilayer optical component, in accord with an embodiment.

With references to FIGS. 1, 1A, 1B, and 1C, the structure of roof layer 102, fluid 107-filled cavity formerly occupied by sacrificial layer 104, underlying layers or substrate 106, and other layers that may be present is optically active through interference effects as a multilayer optical device because optical boundaries having at least some reflection are formed at a top surface 150 and a bottom surface 152 of roof layer 102, and at a top surface 154 of the underlying layer or substrate 106. Further, since roof layer 102 and fluid 107 in the space 105 left by removal of sacrificial layer 104 are transparent or semi-transparent, the wavelengths of incident light 130 at which reflections from these surfaces sum or cancel will be determined by distances between surfaces 150, 152 and 154. The refractive indices of the materials summing and cancelling provides spectral features such as notches 230 and peaks 232 in transmission 234, 134 or reflection 236, 132 at particular wavelengths in a region of interest in the electromagnetic spectrum, as illustrated in FIG. 2A. In many embodiments, some or all of these distances between surfaces are distances chosen to be on the order of wavelengths of light in a portion of the electromagnetic spectrum of interest, meaning that these distances are designed to be in a range of one-fourth wavelength to about ten of the wavelengths, to enhance interference effects. Tuning the multilayer optical device may be accomplished by altering thickness of the fluid-filled cavity, thereby altering spacing between the optical boundaries at the top surface 154 of the underlying layer or substrate and the surfaces 150, 152 of roof layer 102, FIG. 1. Tuning may also be accomplished by replacement of the fluid within the fluid-filled cavity with another fluid having a different index of refraction, as described with reference to FIG. 4A below, because changing the index of refraction of the fluid alters both the relative reflection at each boundary of the fluid-filled cavity, and changes the effective spacing in wavelengths from boundary to boundary. The change in effective spacing in turn changes wavelength of one or more spectral features of spectral response of the device, such as peak 238 in reflectance 240 is shifted in wavelength with respect to peak 232 in response 234, FIG. 2A. In some embodiments, a multilayer optical device has one or more optically active regions having roof layer 102, underlying layer or substrate 106, and a fluid filled space 105 formerly occupied by sacrificial layer 104, capable of performing a desired optical function such as spectrally modifying light in a system, surrounded by one or more other regions having structures that perform other functions such as support, control, fluid conduits, and fluid injection and fluid removal into and out of space 105.

In an embodiment, incident light 130 having multiple spectral components is divided into a reflected component 132 and a transmitted component 134 by the multilayer optical device. A change in shape of the cavity 105 may alter a division of spectral components between reflected component 132 and transmitted component 134.

Figure 3:
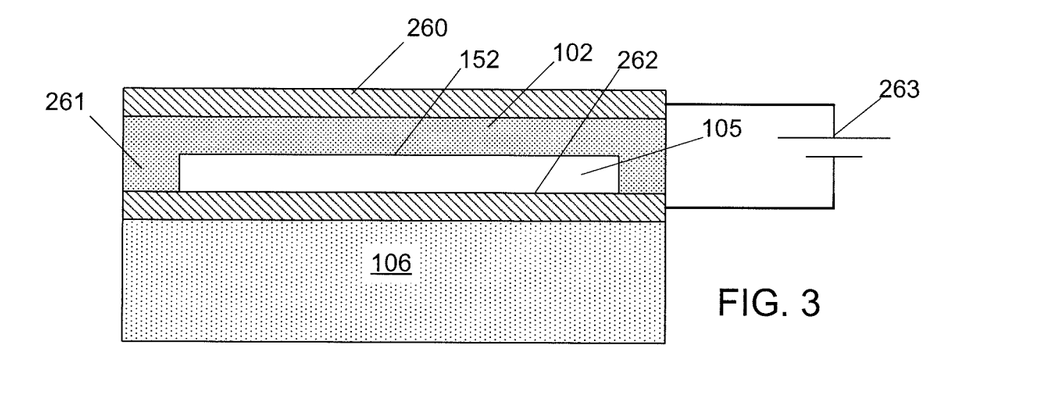
FIG. 3 is a cross section of an electrically tunable, multilayer, optical component, in accord with an embodiment.

In an embodiment illustrated in FIG. 3, where the fluid in the space is air or another compressible gas, adjustment of spacing between optical boundaries at the top surface 154 of the underlying layer or substrate, and the surfaces 150, 152 of roof layer 102, is accomplished electrostatically. In this embodiment, a transparent conductor layer 260 may be formed of a conductive oxide such as tin oxide or indium tin oxide over roof layer 102. In an alternative embodiment having nonconductive supports 261, roof layer 102 itself may be formed of transparent conductive material. Similarly, a second conductive layer 262 is formed underneath the cavity. In this embodiment, application of an electric field between conductive layers 260, 262 by connecting them to a voltage source 263 causes a deflection of roof layer 102, thereby altering an optical distance between lower surface 152 of roof layer 102 and upper surface 154 of substrate 106 or an underlying layer, and altering wavelengths at which spectral modification of light occurs.

Figure 4:
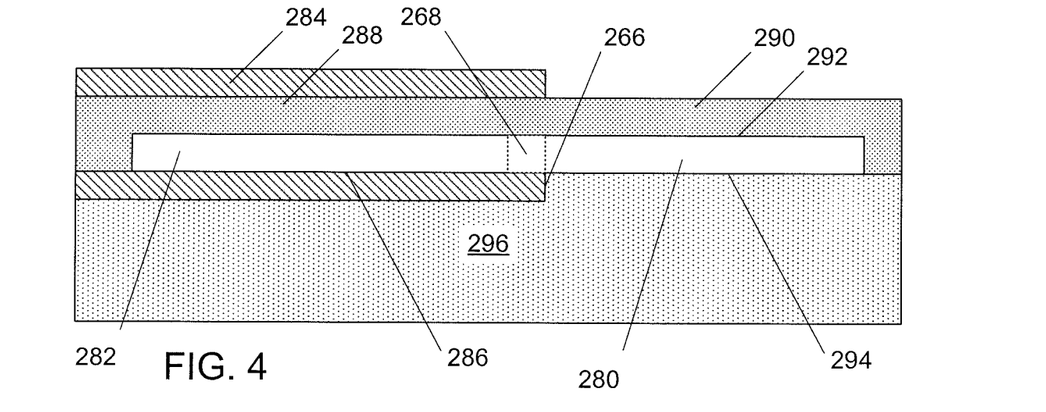
FIG. 4 is a cross section of an alternative embodiment of an electrically tunable, multilayer, optical component.

In an alternative embodiment, as illustrated in FIG. 4, the fluid-filled space where sacrificial layer 104 was removed is divided into two or more compartments, such as an optically active compartment 280 and a pressurizer compartment 282. Pressurizer compartment 282 serves as a component of a controller for introducing fluid into, adjusting pressure of or presence of fluid in, and/or exchanging fluid between a first and a second fluid in, or otherwise control fluid within, optically active compartment 280. Other parts of the controller in typical embodiments include apparatus for applying voltages to electrostatic plates of a pressurizer compartment, or for applying current to electrical heater of a pressurizer compartment, to direct and control fluid. In this embodiment, pressurizer compartment 282 is fitted with a top conductor layer 284 and bottom conductor layer 286, such that a voltage between top and bottom conductor layers 284, 286 provides an electrostatic force that acts to deflect roof layer 288 downwards, compressing fluid in pressurizer compartment 282. Some fluid then flows into optically active compartment 280 and applies pressure to roof layer 290, thereby bowing roof layer outwards and increasing a distance between lower surface 292 of roof layer 290 and top surface 294 of the underlying layer or substrate.

In an alternative embodiment, each pressurizer compartment 282 is fitted with an electrical heating element formed from a resistive, conductive layer on either top or bottom, such as top conductor 284, such that the fluid in the compartment can be heated; as fluid expands when heated, heating the compartment causes an increase in pressure that causes optically active compartment 280 roof layer to bow outwards, increasing distance between lower surface 292 of roof layer 290 and top surface 294 of the underlying layer or substrate.

Figure 4A:
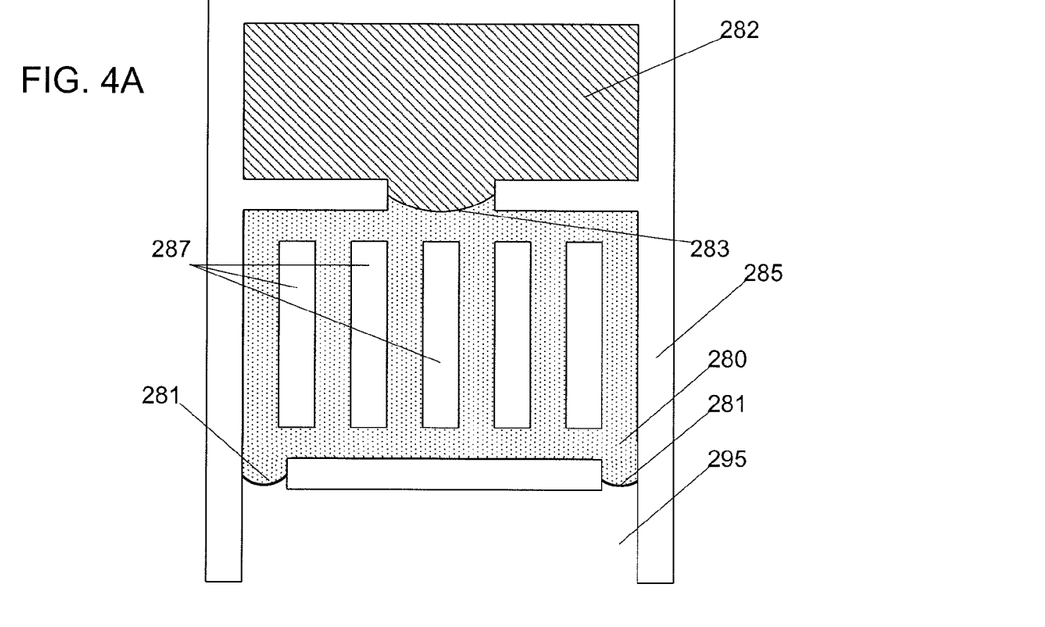
FIG. 4A is a top plan view of an alternative embodiment of a hydraulically switchable optical device capable of operating in a first mode with a first fluid in an optically active chamber, and in a second mode with a second fluid in the optically active chamber.

In an alternative embodiment, as illustrated in FIG. 4A, pressurizer compartment 282 is filled with a first fluid that is a liquid and has a first index of refraction, the first fluid forming a meniscus 283 at a boundary with a second fluid that is immiscible in the first fluid and has a second index of refraction, in an embodiment the second fluid is a gas such as air, and in an alternative embodiment the second fluid is a liquid. With the second fluid in optically active compartment 280, the optically active compartment performs a first optical function.

In the embodiment of FIG. 4A, an increase of pressure in pressurizer compartment 282 caused by heat, electrostatic force, or by any other method known in the art of microfluidics, acts to force a portion of the first fluid from the pressurizer compartment into optically active compartment 280. In so doing, the first fluid displaces the second fluid from optically active compartment 280 into a reservoir compartment 295, thereby replacing the second fluid within optically active compartment 280 with the first fluid, the first fluid advancing to form a second meniscus 281 at a different location than rest meniscus 283. Since the first and second fluid have different indices of refraction, both the relative reflection at each boundary of the fluid-filled cavity and the effective spacing in wavelengths from boundary to boundary therein are altered when the fluid in optically active compartment 280 is changed; causing optically active compartment 280 to perform a second function on incident light. Additional compartments and passageways, including microfluidic switches, valves, and other flow-controlling devices may be provided to control flow of the two or more fluids described into and through the optically active compartment. Microfluidic pumps and fluid transistors operating through electrowetting may be integrated to control or drive fluid flow into optically active compartment 280. It is anticipated that some or all of these passageways, compartments, switches, valves, fluid transistors, and other devices may be integrated on the same substrate 206, 296, as the optical device. Further, optically active compartment 280 of the optical device may in some embodiments be coupled to an optical fiber for transmission of any or all of reflected light, transmitted light, or incident light; and in other embodiments to one or more optoelectronic components fabricated within or located beneath substrate 206, 296 such as a photosensor, photodiode, or laser diode.

The optically active compartment may be switched back to performing its first function by returning the second fluid back into the compartment 280, and the first fluid back into pressurizer compartment 282. The device is therefore switchable between the first and second optical functions according to the presence or absence of the first fluid in compartment 280.

The first and second functions may be considered operating modes and may form a mode pair. It is contemplated that through selection of materials, fluids, thicknesses and spacings as described herein, such mode pairs may be arranged to be spectral filtering and non-filtering; focusing and non-focusing; diffraction grating dispersing wavelengths and non-dispersing; and reflecting and transmitting for a particular wavelength band.

In an embodiment, optically active compartment 280 includes a spacer material 285, and forms a continuous space. That is, spacer material 285 is between and in contact with a first layer (e.g., substrate 106 or conductive layers 262 or 286, FIGS. 3 and 4) and a second layer (e.g., roof layer 102, FIGS. 1 and 3, or roof layer 290, FIG. 4). The second layer is supported by spacer material 285 such that the space is bounded by the spacer (at the edges of the space) and the first and second layers (forming the bottom and top of the space). In this embodiment, the multilayer device may switch between a first operating mode such as a dichroic mirror or optical filter having a first passband wavelength, and a second operating mode having a second passband wavelength.

In an alternative embodiment as illustrated in FIG. 4A, an optically active compartment 280 has structures 287 of spacer a material disposed therein. FIG. 4A shows five discontiguous structures 287; however, other embodiments may include different numbers of structures 287 and such structures may be contiguous. When optically active compartment 280 is filled with air or a fluid having a significantly different index of refraction than that of structures 287, optical function of the device is affected by the pattern, width, and space, of structures 287. In an embodiment where structures 287 have features (e.g., lengths, widths or spaces therebetween) on the order of a wavelength of electromagnetic radiation of interest, structures 287 may result in significant constructive or destructive interference at various wavelengths and angles. It is appreciated that structures 287 that are regular in width and/or spacing may create certain useful effects (e.g., to form a diffraction grating or a Fresnel lens) while irregular structures may create different useful effects (e.g., to create effectively graded refractive index structures or randomly diffusing structures).

In alternative embodiments, structures 287 form a metalens or a metamaterial. For purposes of this document a metalens is an optical device having a pattern of features having width and spacing, whether the widths and spacings are uniform or nonuniform, the widths and spacings between about one tenth and several times a particular wavelength of interest of electromagnetic radiation with which the optical device interacts. A metalens device manipulates or guides electromagnetic radiation of the particular wavelength that is incident thereon, and may serve for example but not limitation as converging or diverging lenses, or as waveguides. In these embodiments the diffraction grating or metalens formed by structures 287 is active and performs an optical function such as diffraction or lensing when the compartment is filled with a fluid having index of refraction significantly different from the index of refraction of the spacer material, but inactive thereby performing a different optical function such as transmission of light when the compartment is filled with fluid having index of refraction near or matching an index of refraction of structures 287. In other embodiments (e.g., as shown in FIGS. 1 and 3) an optically active region that does not include structures 287 may be considered to have a clear aperture.

In an exemplary embodiment, one of the first and second fluids has an index of refraction approximately matching an index of refraction of structures 287, while the other fluid has a significantly different index of refraction. In this embodiment, when the fluid matching an index of refraction of these structures is present in the optically active compartment, these structures optically vanish and optical function of the device is determined by boundaries between other layers. When the fluid having a significantly different index of refraction is present in the compartment, the device has an optical function determined by these structures 287 (for example, as a diffraction grating, when features of structures 287 are on the order of wavelengths of interest).

Figure 5:
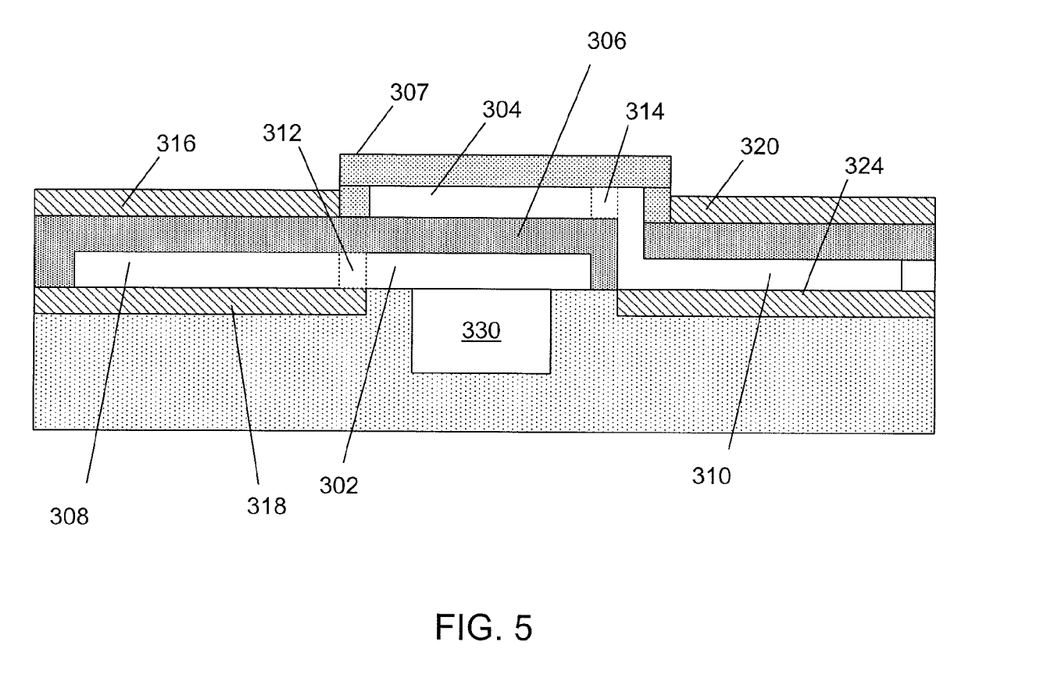
FIG. 5 is a cross section of an alternative embodiment of an electrically tunable, multilayer, optical device having multiple, stacked, adjustably spaced surfaces.

In yet another alternative embodiment, as illustrated in FIG. 5, the steps described with reference to FIG. 2 are repeated, to form two fluid-filled optically active compartments, a lower optically active compartment 302 and an upper optically active compartment 304, stacked vertically upon each other with a roof layer 306 of lower compartment 302 separating them. Upper optically active compartment 304 has a roof layer 307. In this embodiment, two pressurizer compartments 308 and 310 are provided, where each of pressurizer compartments 308, 310 has a passage for fluid communication with a respective one of the optically active compartments 302, 304. In the illustrated embodiment, pressurizer compartment 308 or an electrowetting-based fluid pump (not shown) has a fluid passage through an optional separator 312 to lower optically active compartment 302, and pressurizer compartment 310 has a passage through an optional separator 314 to upper optically active compartment 304. In this embodiment, each of pressurizer compartments 308 and 310 includes a pair of electrodes. Pressurizer compartment 308 has electrodes 316 and 318, and pressurizer compartment 310 has electrodes 320 and 324, as shown. When an electrostatic field is applied to a given pair of electrodes 316, 318, 320 and 324, the electrodes apply an electrostatic force to the corresponding fluid, adjusting spacing between optically active compartments 302 and 304, thereby altering wavelengths at which reflected wavefronts from those surfaces interact with each other, and thus tuning the system. In an embodiment, a greater pressure in lower optically active compartment 302 than a pressure in upper optically active compartment 304 causes deflection of both roof layers 306 and 307.

In some embodiments, that change optical function through replacement of fluid in optically active compartments 302 and 304, instead of through deflection of the roof layers, a single pressurizer compartment 308 or other fluid source may be provided.

Figure 4B:
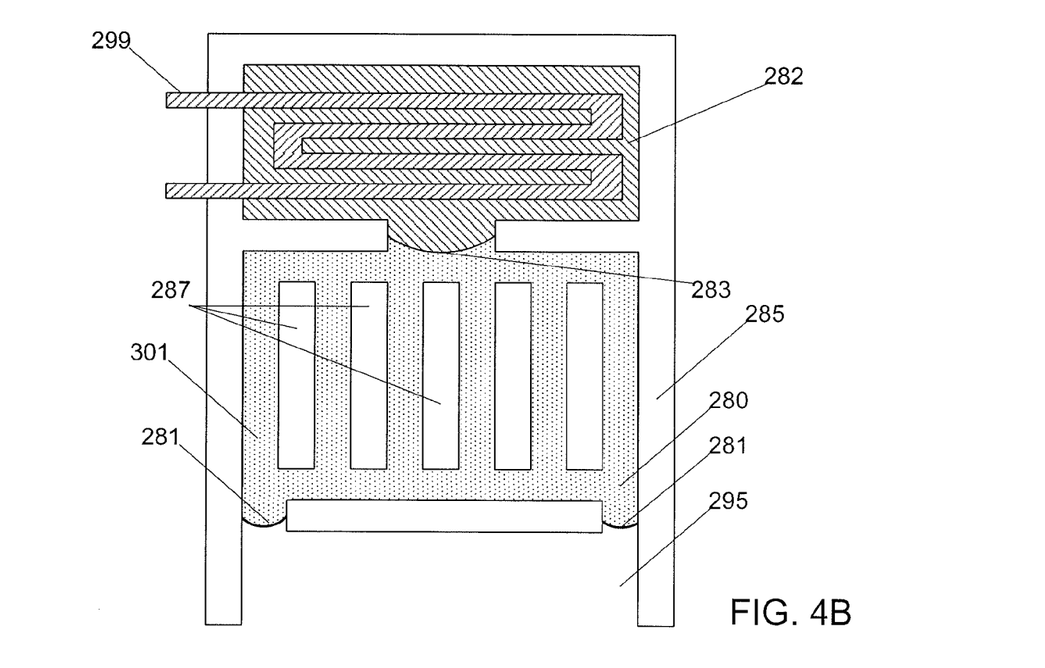
FIG. 4B is a top plan view of an alternative embodiment of the switchable optical device having an electrothermal pump.

Alternative embodiments may use pumping technologies other than electrostatic forces (for example, pumps based on electrowetting or on temperature changes) to move fluids into, or remove fluids from, optically active compartments. For example, as illustrated in FIG. 4B, in an embodiment a multilayer optical device has a resistive heating element 299 formed of one or more lines of an electrically resistive material capable of applying heat to pressurizer compartment 282 such that a temperature increase caused by the heating element causes fluid within the pressurizer compartment 282 to expand, or to partially vaporize and expand, driving part of the fluid to flow into an optically active compartment 301, for purposes of this document a pressurizer compartment equipped with such a heating element is denoted an "electrothermal pump." In an alternative embodiment, an electrowetting pump causes a fluid to flow into the optically active component. Other microfluidic components known in the art may also be used to pump, switch, or control flow of fluid into an optically active compartment 301.

In a particular embodiment, the optically active compartments 302, 304 may be formed over an optoelectronic device such as a laser diode or a photosensor 330.

In particular embodiments, the multilayer optical device described herein is coupled to a controller that controls, drives, or changes fluid in one or more spaces of optically active compartments. In an embodiment, the controller is a fluidic device that directly changes fluid in the space. In an alternative embodiment, the controller applies voltage to electrostatic plates of pressurizer chambers, or an electric current to a heater of pressurizer chambers, in order to compress or drive a fluid into or out of an optically active compartment of the device.

Figure 6:
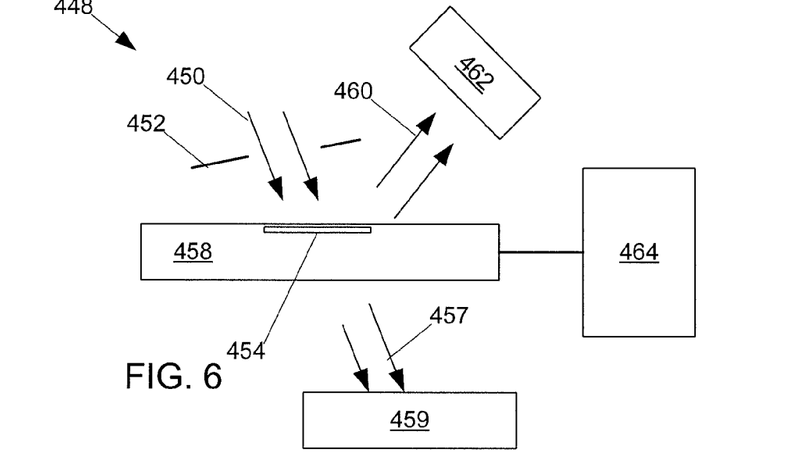
FIGS. 6, 7, and 8 illustrate optical paths of systems utilizing embodiments of switchable optical devices such as herein described.
Figure 7:
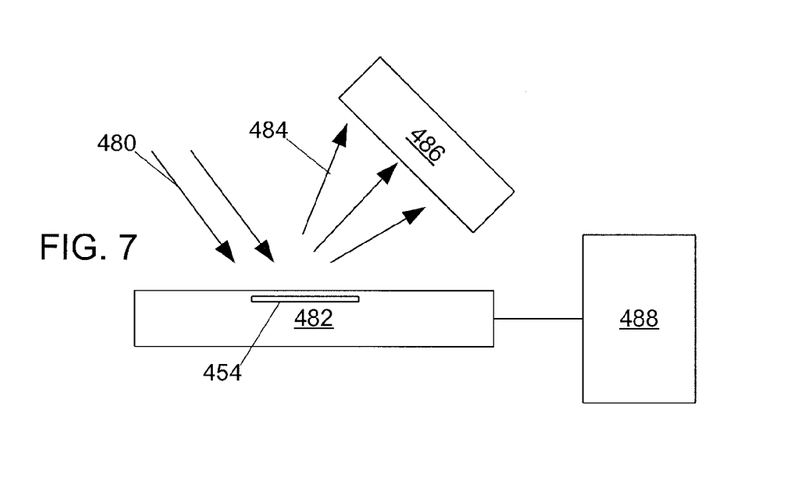
Figure 8:
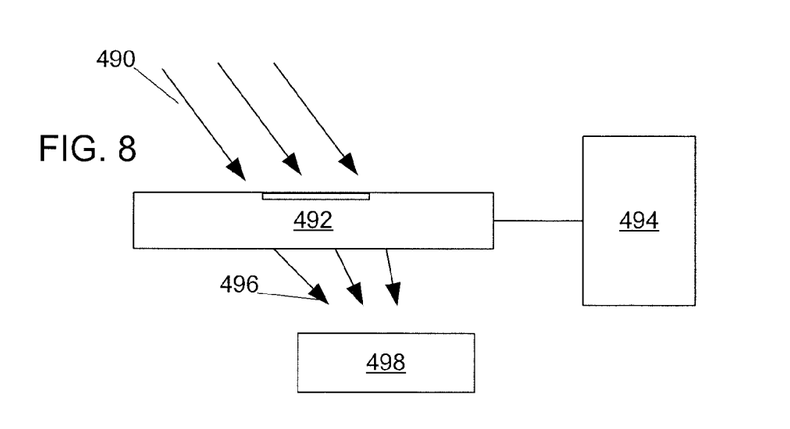

Devices having structure as illustrated in FIG. 1, 1A, 1B, 1C, 3, 4A, 4B, or 5, and fabricated according to FIG. 2, may be used in systems having optical pathways including those illustrated in FIGS. 6, 7, and 8, as well as other optical pathways. For example, an optical path 448 (FIG. 6) may admit light 450 through an aperture 452 into an optically active area 454 of a switchable, microfluidic optical device 458 according to FIG. 1, 1A, 1B, 1C, 3, 4, or 5. Light 457 passed by optical device 458 may impinge on a photodetector or imaging device 459. In this embodiment, optical device 458 serves as a dichroic mirror or bandstop filter. Similarly, light 460 reflected by optical device 458 may impinge on imaging device or photodetector 462. Optical device 458 has at least a first and a second optical function, according to fluid presence, fluid composition, or fluid pressure, the fluid being controlled by controller 464 so that device 458 performs either the first or the second function.

Similarly, in a spectrograph as illustrated in FIG. 7, incident light 480 may be dispersed according to wavelength by a switchable, microfluidic optical device 482 including optically active area 454 according to FIG. 1, 1A, 1B, 1C, 3, 4A, 4B, or 5 acting as a diffraction grating. The dispersed light 484 may in turn impinge on a photodetector 486. Switchable, microfluidic device 482 of FIG. 7 may operate under control of controller 488 in a first mode to disperse one band of wavelengths of light, but in a second mode to disperse a second band of wavelengths of light, for example to operate as a spectrograph that is switchable from near infrared to far infrared wavelength operation.

Incident light 490 impinging on an active area of a metalens device 492 according to FIG. 8, operating under control of controller 494, may be focused or otherwise modified by metalens device 492 according to a first, or to a second, mode of operation. The focused or modified light 496 impinges on a photodetector 498. The mode of operation of metalens device 492 may be dependent on fluid presence or pressure in the chambers of an active area of device 492.

Thus, there have been shown and described several embodiments having one or more cavities having dimensions on the order of a wavelength of light, which change in performance and/or function as fluid is added or removed to and from the cavities; as fluid pressure is changed within the cavities, or as fluid is changed from one fluid type to another fluid type. It will be apparent to those skilled in the art, however, that many changes, variations, modifications, and other uses and applications for the subject product are possible, and also changes, variations, modifications, and other uses and applications which do not depart from the spirit and scope of the invention are deemed to be covered by the invention which is limited only by the claims which follow.

What is claimed is:

1. A multilayer optical device comprising:
an arrangement, formed on a substrate, of at least a first layer, a second layer, and a space provided therebetween, said space having a height,
wherein said arrangement of said first layer, said second layer, and the space between is capable of producing transmitted, reflected, or dispersed spectrally modified electromagnetic energy from electromagnetic energy incident upon the arrangement, wherein an optical function of the optical device is dependent at least in part on interference effects,
an apparatus for changing a fluid within an optically active area of the space from the first fluid having a first refractive index to a second fluid having a second refractive index, and wherein an optical function of the multilayer optical device is a first function when the first fluid is in the space, and is a second function, differing from the first function, when the second fluid is in the space,
wherein the apparatus for changing the fluid within an optically active area comprises one of:
an apparatus for applying a voltage to a top conductor and a bottom conductor, wherein a pressurizer compartment is fitted with the top conductor and the bottom conductor, such that the voltage between the top and bottom conductors provides an electrostatic force that acts to deflect a roof layer of the pressurizer compartment downward, compressing the second fluid in the pressurizer compartment to flow into the optically active area, and to displace the first fluid from the optically active area into a reservoir compartment, thereby replacing the first fluid within the optically active area, and an apparatus for applying a current to an electrical heater, wherein a pressurizer compartment is fitted with the electrical heater, such that the second fluid in the pressurizer compartment is heated, as the second fluid expands when heated, causing an increase in pressure in the pressurizer compartment that acts to force the second fluid to flow from the pressurizer compartment into the optically active area, and to displace the first fluid from the optically active area into a reservoir compartment, thereby replacing the first fluid within the optically active area.

2. The multilayer optical device of claim 1 wherein the first layer is the substrate.

3. The multilayer optical device of claim 1 further comprising a spacer disposed between and in contact with the first layer and the second layer, wherein said second layer is supported by said spacer, and said space is bounded by said spacer, first layer, and second layer.

4. The multilayer optical device of claim 3 wherein said spacer is discontiguous and comprises two or more structures separated from each other in a pattern.

5. The multilayer optical device of claim 4 wherein the pattern of structures of the spacer is capable of functioning as a diffraction grating.

6. The multilayer optical device of claim 5 further comprising a first fluid disposed within the space.

7. The multilayer optical device of claim 6 having structures such that temperature or electrostatic forces acting upon fluid in the pressurizer compartment determine whether said first fluid is present or absent in the space.

8. The multilayer optical device of claim 1 wherein said first and second optical functions form mode pairs selected from the group consisting of:
diffracting and non-diffracting, spectral filtering and non-filtering; focusing and non-focusing; and reflecting and transmitting for a band of wavelengths.

9. The multilayer optical device of claim 1, wherein an optical function of the optical device changes with a pressure of the fluid within said space.

10. The multilayer optical device of claim 1 having structures such that temperature or electrostatic forces acting upon the first fluid in the pressurizer compartment determine the pressure of the fluid within the space.

11. The multilayer optical device of claim 1 wherein said space defines an optically active region having one of a clear aperture, a diffraction grating, or a metalens.

12. The multilayer optical device of claim 11, further comprising an apparatus for changing a fluid within the optically active region from a first fluid to a second fluid.

13. The multilayer optical device of claim 12 wherein the second fluid is a liquid.

14. The multilayer optical device of claim 12, wherein the optical device has:
a first optical function dependent on a refractive index of the first fluid and the height of the space between the first and second layers when the first fluid is present in the optically active region; and
a second optical function dependent upon a refractive index of the second fluid and the height of the space between the first and second layers when the second fluid is present in the optically active region.

15. The multilayer optical device of claim 14 wherein the first fluid is selected to cause the optical function of the optical device to comprise a first function determined by an index of refraction of said first fluid, and such that the presence of a second fluid having a different index of refraction in the optically active region, causes the optical function of the optical device to comprise a different function.

16. The multilayer optical device of claim 1 wherein said device includes one or more thin films deposited by at least one of sputtering, evaporation, and chemical vapor deposition.

17. The multilayer optical device of claim 1, having structures for introducing a first fluid within said space such that the optical device is capable of operating in a first mode with the first fluid present in the space and a second mode with the first fluid absent from the space.

18. The multilayer optical device of claim 17 wherein the first fluid is a liquid.

19. The multilayer optical device of claim 17 wherein said first and second modes form mode pairs selected from the group consisting of: spectral filtering and non-filtering; focusing and non-focusing; and reflecting and transmitting for a band of wavelengths.

20. The multilayer optical device of claim 19 further comprising a controller in fluid communication with said space operable to establish the absence or presence of said first fluid in said space for causing the optical device to act in a selected one of said first and second modes.

21. The multilayer optical device of claim 1 wherein the second layer is a thin film.

22. An optical detector system comprising:
a multilayer optical device comprising an arrangement, formed on a substrate, of at least a first layer, a second layer, and a spacer provided therebetween, said spacer having a spacer height, wherein said arrangement of said first layer, said second layer and said spacer defines a space, the device being capable of modifying incident electromagnetic energy in a spectrally-dependent manner through interference, and said space is in fluid communication with structures for receiving a first fluid such that the optical device operates in a first mode with the first fluid absent in the space, and in a second mode with the first fluid present in the space;
a photodetector in optical communication with said optical device for receiving modified electromagnetic energy from the multilayer optical device; and
a controller in fluid communication with said space and operable to establish the absence or presence of said first fluid in said space,
an apparatus for changing a fluid within an optically active area of the space from the first fluid having a first refractive index to a second fluid having a second refractive index, wherein the apparatus for changing the fluid within an optically active area comprises one of:
an apparatus for applying a voltage to a top conductor and a bottom conductor, wherein a pressurizer compartment is fitted with the top conductor and the bottom conductor, such that the voltage between the top and bottom conductors provides an electrostatic force that acts to deflect a roof layer of the pressurizer compartment downward, compressing the second fluid in the pressurizer compartment to flow into the optically active area, and to displace the first fluid from the optically active area into a reservoir compartment, thereby replacing the first fluid within the optically active area, and
an apparatus for applying a current to an electrical heater, wherein a pressurizer compartment is fitted with the electrical heater, such that the second fluid in the pressurizer compartment is heated, as the second fluid expands when heated, causing an increase in pressure in the pressurizer compartment that acts to force the second fluid to flow from the pressurizer compartment into the optically active area, and to displace the first fluid from the optically active area into a reservoir compartment, thereby replacing the first fluid within the optically active area.

23. The optical detector system of claim 22 wherein said the first and second modes form a mode pair selected from the group of mode pairs consisting of:

spectral filtering and non-filtering; focusing and non-focusing; diffracting and non-diffracting; and reflecting and transmitting for a band of wavelengths.

24. The optical detector system of claim 22 wherein the multilayer optical device is a wavelength-selective filter that, when configured to operate in the first mode, transmits a portion of an electromagnetic radiation spectrum to said photodetector, and when configured to operate in the second mode transmits a greater portion of the electromagnetic radiation spectrum to said photodetector.

25. The optical detector system of claim 22 wherein a first spectral response associated with the first mode exhibits at least one spectral feature selected from the group consisting of a notch and a peak within a given operating wavelength range, and a second spectral response associated with the second mode exhibits a different spectral feature within the operating wavelength range.

26. The optical detector system of claim 22, wherein the controller is capable of placing one of a first fluid and a second fluid within the space; and the controller is configured to tune said optical detector system, by selectively placing one of said first fluid and said second fluid within said space to cause said multilayer optical device to exhibit a resulting one of a first spectral feature and a second spectral feature, respectively.

* * * * *